United States Patent [19]

Scheinert

[11] 4,256,296

[45] Mar. 17, 1981

[54] PRINTED CIRCUIT BOARD ASSEMBLY FIXTURE

[76] Inventor: Karol V. Scheinert, 2285 Montebello Dr. West, Colorado Springs, Colo. 80907

[21] Appl. No.: 124,653

[22] Filed: Feb. 25, 1980

[51] Int. Cl.³ .............................................. B25B 5/02
[52] U.S. Cl. ...................................... 269/45; 269/67; 269/297; 269/903; 29/741
[58] Field of Search .................... 269/321 WE, 67, 37, 269/45, 296, 297; 29/837-840, 741; 312/245; 248/346, 460, 174, 454

[56] References Cited

U.S. PATENT DOCUMENTS

| 3,347,187 | 10/1967 | Khoury | 312/245 |
| 3,395,439 | 8/1968 | Palesi et al. | 269/321 WE |
| 3,885,762 | 5/1975 | Sebastiani | 248/460 |
| 4,030,717 | 6/1977 | Serlovsky | 269/321 WE |

Primary Examiner—Robert C. Watson

[57] ABSTRACT

This printed circuit board assembly fixture is of such structure, that it will enable an assembler to assemble a multiple number of printed circuit boards at the same time, and it consists of an angular support frame, so as to enable the user to work at a comfortable angle on a work bench. It further includes a rail-containing assembly, in which the rails are adjustable by thumb screws, so as to accommodate printed circuit boards of various sizes.

1 Claim, 4 Drawing Figures

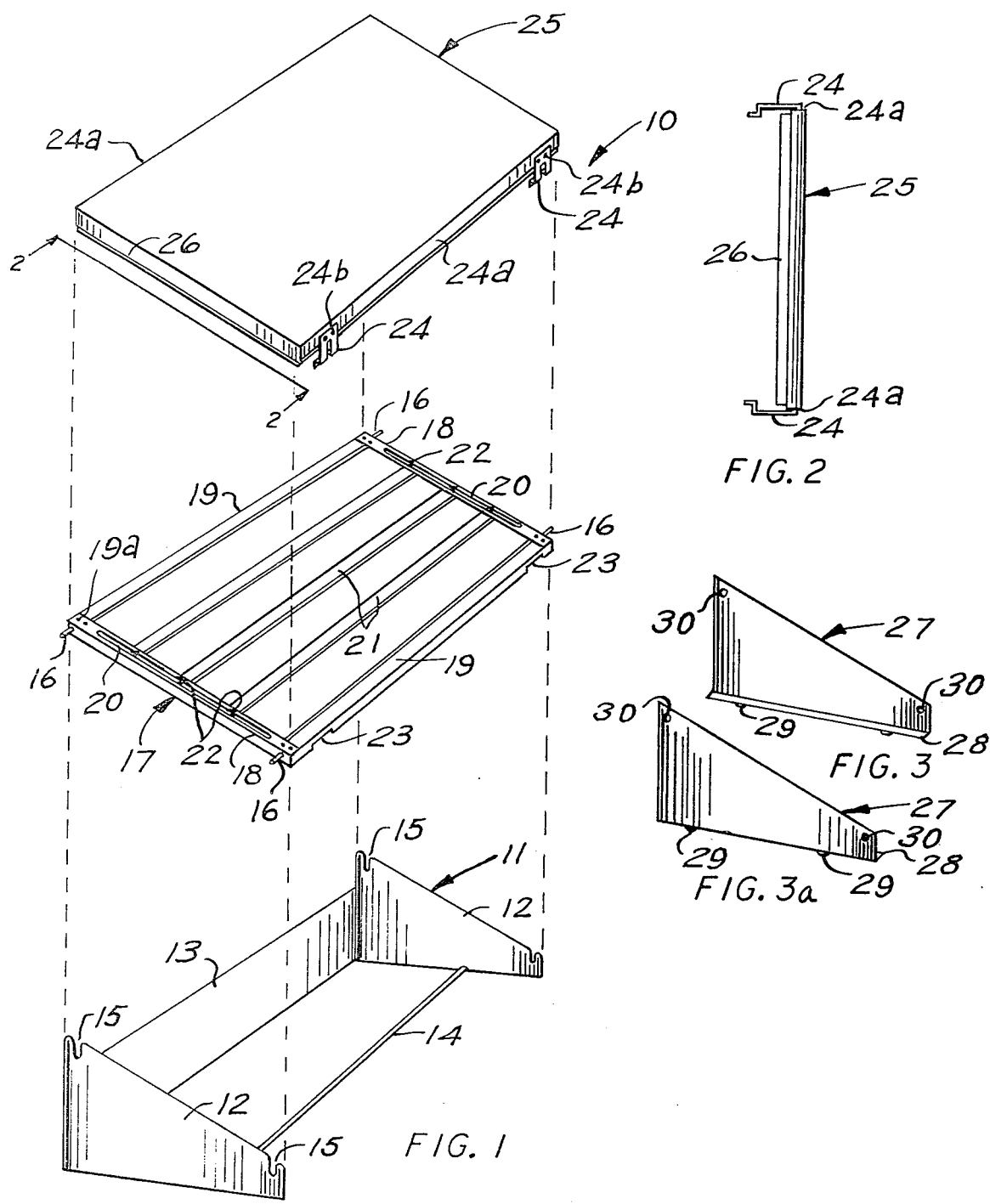

PRINTED CIRCUIT BOARD ASSEMBLY FIXTURE

This invention relates to jigs, and more particularly, to a printed circuit board assembly fixture.

It is the principal object of this invention to provide a printed circuit board assembly fixture, which will expedite the assembly of printed circuit boards, by enabling the user to assemble a plurality of the aforementioned boards simultaneously, instead of one or two at a time, as was the procedure of the prior art.

Another object of this invention is to provide a printed circuit board assembly fixture, which will include in its structure a plurality of slidable rails, that will be secured in any desired position, to thus accommodate printed circuit boards of various sizes.

A further object of this invention is to provide a printed circuit board assembly fixture, which will be supported on an angular rack, so as to enable the user to work comfortably on the printed circuit boards, and the present invention will be small enough in size to be placed on a work bench in front of the assembler.

Other objects of the present invention are to provide a printed circuit board assembly fixture, which is simple in design, inexpensive to manufacture, rugged in construction, easy to use and efficient in operation.

These and other objects will be readily evident upon a study of the following specification and the accompanying drawing wherein:

FIG. 1 is a partially exploded perspective view of the present invention;

FIG. 2 is an enlarged view of the top cover, taken along the line 2—2 of FIG. 1;

FIG. 3 is a perspective view, showing a modified form of an angular support member for the right side of the invention, and FIG. 3a is a perspective view, showing a modified form of an angular support member for the left side of the invention.

According to this invention, a fixture 10 is shown to include a support rack 11, having a pair of parallel side members 12 of angular configuration, which are integral of a rear member 13. A bar 14 is fixedly secured, between side members 12, by suitable means (not shown), and imparts rigidity to support rack 11, which will rest on a work bench. A pair of recessed openings 15, in the top surface of side members 12, provides a means of removably receiving the pins 16, projecting from frame 17. Pins 16 are fixedly secured, in a suitable manner, to the ends of end members 18, so as to support frame 17 in the recessed openings 15 of side members 12 of rack 11. A pair of side members 19 are fixedly secured to the end of members 18, by suitable fasteners 19a, and an elongated slot 20, through the tops of members 18, provides a means of sliding a plurality of rails 21, by loosening the thumb screws 22 that are received in the rails 21. Rails 21 are adjustable, so as to clampingly engage the edges of a plurality of printed circuit boards (not shown), of various sizes, to thus enable the user to solder the leads of the components on the back side of the circuit boards.

A pair of spaced-apart recessed openings 23, in one side of each of the side members 19, provide a means of receiving the spring clips 24, which are fixedly secured to the sides 24a of top cover 25, by suitable fasteners 24b, and a foam material pad 26 is fixedly secured to one side of cover 25, for contact with the components to be soldered.

Cover 25 is used to snap over the rails 21, by means of the spring clips 24, so as to hold the components in place on the circuit boards. Once the cover 25 is snapped in place, the frame 17 will lift out from the support rack 11, and then will be turned over and placed in the rack 11, in this inverted position, so as to enable the user to easily solder the leads of the components to the back of the printed circuit board.

Referring now to FIGS. 3 and 3a, a pair of suppport members 27, which are a modified form of support for frame 17, are angular in configuration, and include a bottom lip 28, to which is fixedly secured a pair of rubber feet 29. If used instead of rack 11, the openings 30 will receive the pins 16 of frame 17, for support thereof.

While various changes may be made in the detail construction, it is understood that such changes will be within the spirit and scope of the present invention, as is defined by the appended claims.

What I now claim is:

1. A printed circuit board assembly fixture, comprising, in combination, a support rack for placement on a work bench, a frame received on said rack for adjustably receiving a plurality of said printed circuit boards, and a top cover snapably engaging said frame for holding the components in place to be soldered, said support rack comprising a pair of parallel, spaced-apart side members that are fixedly secured to a rear member, and a rod fixedly secured between said side members for rigidity, a pair of spaced-apart recessed openings being included in the top edges of said members of said rack, for removably receiving pins fixedly secured, and projecting from, a pair of end members of said frame, and said end members being fixedly secured to a pair of parallel, spaced-apart side members of said frame, and a plurality of rails slidably received on said end members of said rack, and are secured by thumb screws, in each end, that are slidable in an elongated slot through said end members of said frame, and said printed circuit boards being held in place between said plurality of rails by their side edges, a pair of spaced-apart recessed openings being included in said side members of said frame, for removably receiving a pair of spaced-apart spring clips secured fixedly to the sides of said top cover, and a foam pad fixedly secured to the bottom surface of said top cover, for holding said components to be soldered in place.

* * * * *